United States Patent [19]

Hoppe et al.

[11] Patent Number: 5,800,763
[45] Date of Patent: Sep. 1, 1998

[54] METHOD FOR PRODUCING DATA CARRIERS WITH EMBEDDED ELEMENTS

[75] Inventors: Joachim Hoppe; Arno Hohmann, both of Munich, Germany

[73] Assignee: Giesecke & Devrient GmbH, Munich, Germany

[21] Appl. No.: 535,877

[22] Filed: Sep. 28, 1995

[30] Foreign Application Priority Data

Oct. 6, 1994 [DE] Germany .................. 44 35 802.4

[51] Int. Cl.$^6$ .................. B29C 39/10; B29C 70/70
[52] U.S. Cl. .................. 264/255; 264/272.11; 264/272.15; 264/271.1
[58] Field of Search .................. 264/250, 255, 264/271.1, 272.11, 272.15, 272.17; 425/112, 116, 544

[56] References Cited

U.S. PATENT DOCUMENTS

| | | | |
|---|---|---|---|
| 4,216,577 | 8/1980 | Badet et al. | 264/272.17 |
| 4,450,024 | 5/1984 | Haghiri-Tehrani et al. | 264/272.17 |
| 4,746,392 | 5/1988 | Hoppe | 264/272.17 |
| 4,770,833 | 9/1988 | Hughes | 264/272.15 |
| 4,789,512 | 12/1988 | Hughes | 264/272.15 |
| 4,961,893 | 10/1990 | Rose | 264/272.15 |
| 5,417,905 | 5/1995 | Lemaire et al. | 264/266 |
| 5,498,388 | 3/1996 | Kodai et al. | 264/263 |
| 5,510,074 | 4/1996 | Rose | 264/261 |

FOREIGN PATENT DOCUMENTS 1306058  8/1992  Canada.

*Primary Examiner*—Angela Ortiz
*Attorney, Agent, or Firm*—Stevens, Davis, Miller & Mosher, L.L.P.

[57] ABSTRACT

The card body of a data carrier with elements disposed therein, for example an electronic module, is produced from a pressed molding compound in a pressing apparatus. The elements to be embedded in the card body are preferably incorporated in the pressing apparatus and positioned and fixed there before the pressing operation.

12 Claims, 3 Drawing Sheets

METHOD FOR PRODUCING DATA CARRIERS WITH EMBEDDED ELEMENTS

FIELD OF THE INVENTION

This invention relates to a method for producing a data carrier with a card body having two plane-parallel main surfaces and at least one element, for example an electronic module or magnetic stripe, etc., disposed therein. The invention furthermore relates to an apparatus for carrying out this method.

BACKGROUND OF THE INVENTION

In the past various methods for producing data carriers of the abovementioned type have become known. For example multilayer data carriers are produced by connecting individual layers under the action of heat and pressure, which is generally referred to as the laminating technique. Elements to be incorporated in the card body can thereby be inserted in the layer structure in specially provided recesses before lamination. It has also been proposed to stamp single-layer card bodies out of a foil, whereby a recess can be simultaneously produced, e.g. for receiving an electronic module.

Finally it has become known e.g. from EP 0 277 854 B1 to manufacture data carriers with an embedded electronic module by injection molding. One provides an injection mold having a cavity whose dimensions correspond to those of the data carrier. Before injection of the plastic compound the electronic module is placed in the cavity on one half in such a way that the contact surfaces of the module lie flat against the half of the cavity and are fixed in this position by suction air. After that the plastic compound is injected via a lateral edge of the mold to form the card body so that the module is surrounded in form-fitting fashion by plastic compound. Suitable shaping of the casting compound of the electronic module causes the latter to be anchored reliably in the card body. The data carrier can now be removed from the mold.

To guarantee reliable fixation of the electronic module in the cavity during the injection process one can take additional measures. For example the module can be urged by a spring-mounted plate against the cavity half to which it is fixed which is lowered during injection of the plastic compound.

One obtains uniform and complete filling of the cavity with plastic material in injection molding by injecting the material into the cavity at very high pressure. This involves relatively elaborate apparatus since one must produce the high injection pressure, on the one hand, and apply high locking forces to the cavity to prevent its halves from "spreading apart" during the injection process, on the other hand. This makes injection molding tools quite expensive, so that injection molded articles in general and injection molded data carriers in particular can frequently be manufactured rationally only in high numbers.

SUMMARY OF THE INVENTION

It is therefore the object of the invention to propose a new method and an apparatus for producing single- or multilayer data carriers in which one of the abovementioned elements is optionally embedded.

This problem is solved by the characterizing features of the independent claims.

The basic idea of the invention is that at least part of the data carrier is produced by the pressing method by pressing plastic granular material or powder. The elements to be optionally embedded in the card body are preferably incorporated at the desired position in the plastic granular material or powder located in the pressing apparatus, and the plastic granular material or powder only then pressed.

The new method thus has the decisive advantage that the elements to be embedded in the card body are already surrounded completely by plastic compound before the actual pressing operation. The actual material forming process by the pressing operation is thus independent in terms of time from the embedding of the elements in the plastic compound and one can completely or largely dispense with additional aids for positioning and fixing the elements. Simultaneously the elements are incorporated in the card body especially gently since they are already protected by the surrounding plastic compound during the pressing operation.

The advantages obtained with the invention are also to be seen in the fact that the apparatus for carrying out the method need not be elaborate. A pressing apparatus thus comprises only a die which is charged with plastic granular material and softened there, and a pressure ram for giving the softened plastic compound the desired shape. One can also mix additives locally with the plastic granular material in simple fashion for producing certain effects in the finished card body of the data carrier. Finally, a homogeneous distribution of the plastic material arises during the pressing operation without preferred directions in the molecular orientation which can lead to breaking points in the data carrier.

According to a first embodiment example of the invention one produces a data carrier containing in its interior an additional element, for example an electronic module for noncontacting data exchange. For this purpose the die is charged with a first quantity of plastic granular material and the element placed on the resulting first layer and covered with a second quantity of plastic granular material, so that the element is located between two layers and surrounded completely by plastic material. The granular material is then softened and pressed with the pressure ram to form the card body.

According to a further embodiment example of the invention one produces a data carrier containing an additional element located partly on the surface of the card body, for example an electronic module for contacting data exchange. For this purpose the die is charged with a measured quantity of plastic granular material, and the element either embedded in the plastic granular material at the desired position or pressed into the softened granular material with the help of the pressure ram.

According to a third embodiment example of the invention the die or pressure ram has raised areas for forming recesses, when the softened plastic material is pressed, for receiving elements in the card body. In this case the elements are incorporated in the card body in a separate method step.

Finally, according to a further embodiment example of the invention the data carrier can be provided during the pressing operation with cover foils which are inserted in the mold cavity and on which additional elements are optionally mounted. For example a foil with magnetic stripes can be inserted in the die and the die then charged with plastic granular material which connects with the foil during the pressing operation, as in the laminating technique.

BRIEF DESCRIPTION OF THE DRAWINGS

Some embodiment examples and further advantages of the invention will be explained more closely in connection with the following figures, in which

DESCRIPTION OF THE PREFERRED EMBODIMENTS

Figure 1:
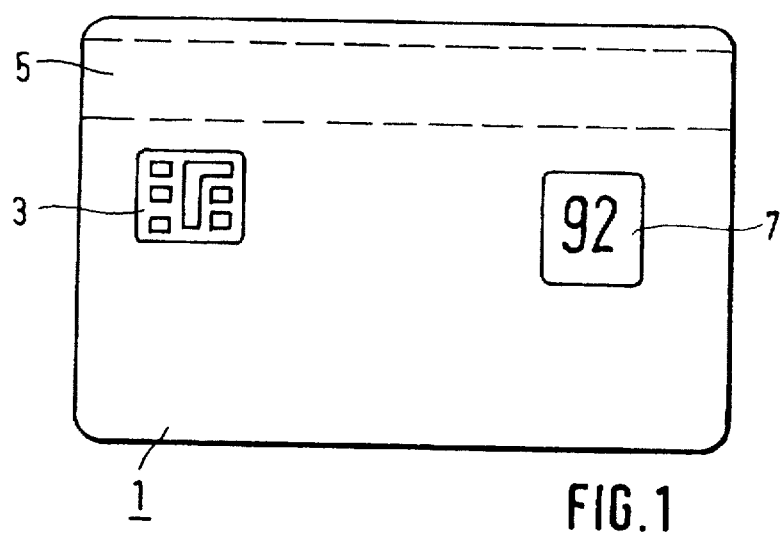
Figure 2A:
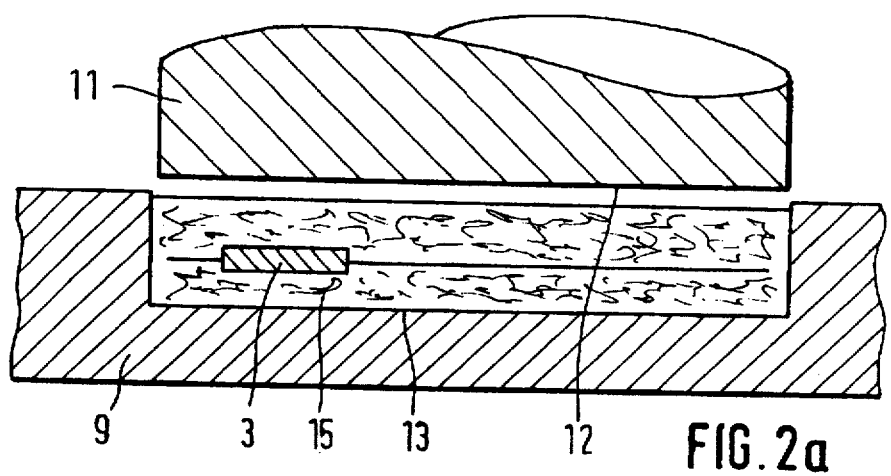
Figure 2B:
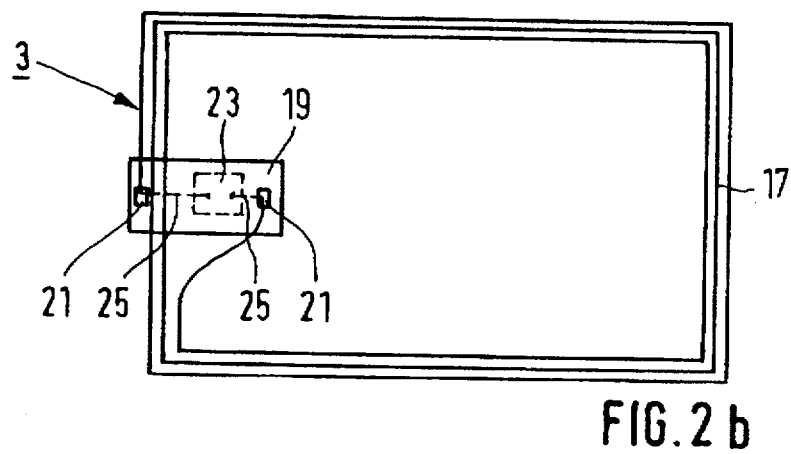
Figure 3:
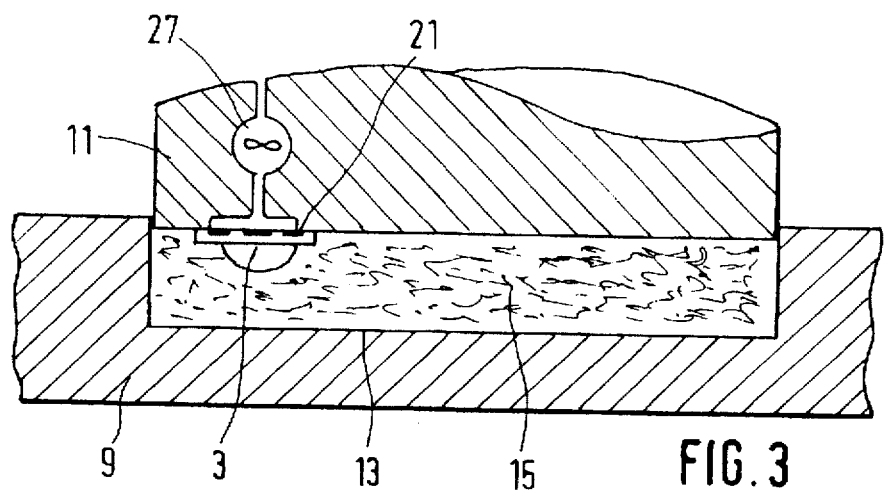
Figure 4:
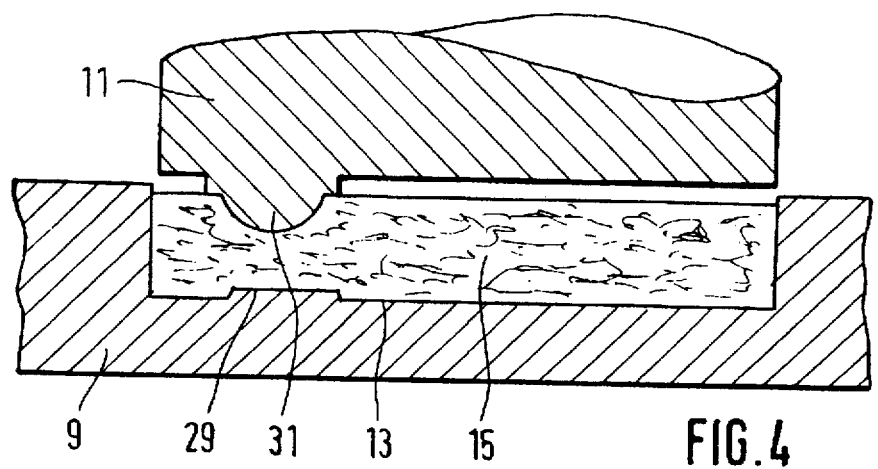
Figure 5A:
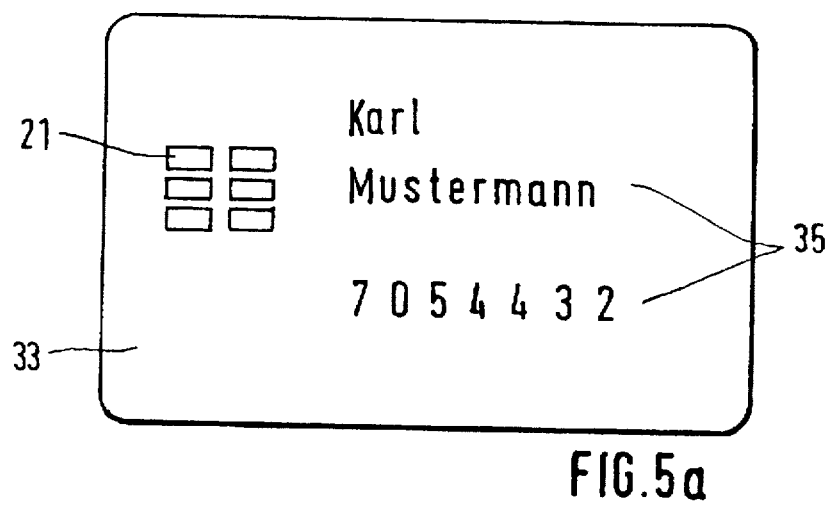
Figure 5B:
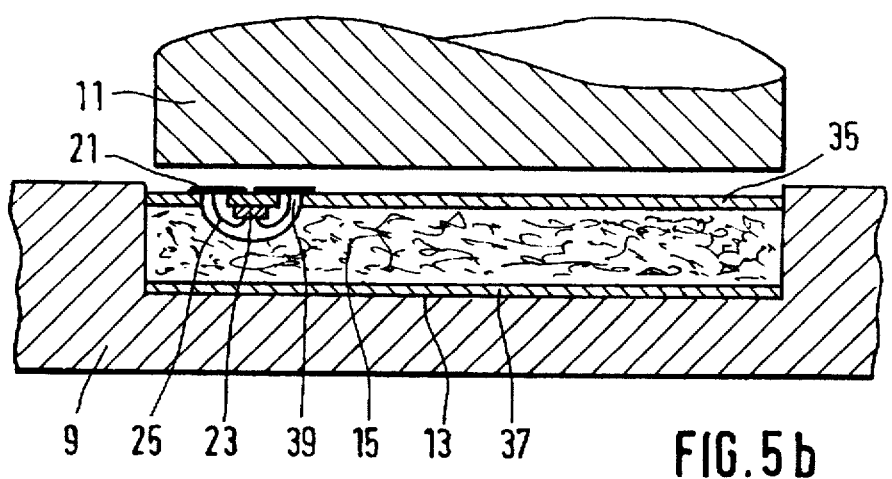

FIG. 1 shows a data carrier in plan view,

FIG. 2a shows a pressing apparatus in cross section,

FIG. 2b shows an element inserted in the pressing apparatus in plan view,

FIG. 3 shows a pressing apparatus in cross section,

FIG. 4 shows a pressing apparatus with raised areas in cross section,

FIG. 5a shows a carrier foil in plan view,

FIG. 5b shows a pressing apparatus with inserted foils in cross section.

FIG. 1 shows a data carrier in plan view. The data carrier has dimensions defined in an ISO standard designated ISO 7810. In the main surfaces of data carrier 1 different elements can be embedded depending on its use, for example electronic module 3, magnetic stripe 5 or hologram 7. For certain applications of the data carrier the elements can also be located in the interior of the card body, e.g. an electronic module for noncontacting data exchange. Those elements located partly on the surface of the card body are in a predetermined or standardized position.

FIG. 2a shows in cross section a pressing apparatus consisting of die 9 and pressure ram 11 with end face 12 which corresponds to the main surface of the card body. Die 9 contains recess 13 whose base surface corresponds to the main surface and whose depth at least to the thickness of the card body. With the pressing apparatus open, recess 13 in die 9 is charged with a measured quantity of molding compound 15, consisting e.g. of plastic granular material or plastic powder, which is necessary for producing the desired molding, in this case card body, with a predetermined thickness. Molding compound 15 is then heated to the point of flowability so that it fills under pressure the entire mold cavity arising between pressure ram 11 and die 9 when the pressing apparatus is closed. When the card body has hardened the pressing apparatus is opened and the card body removed or ejected. Die 9 and pressure ram 11 are generally fastened to the upper and lower mounting plates of a press and continuously heated or designed to be heatable and coolable.

As FIG. 2a shows, an element, e.g. an electronic module for noncontacting data exchange, is embedded in molding compound 15 so that it is surrounded on all sides by molding compound and thus located in the interior of the completed card body. For this purpose recess 13 is initially charged with a first quantity of molding compound 15 on which electronic module 3 is placed. Recess 13 is then charged with a second quantity of molding compound 15. This basically completes the shaping of the card body; molding compound 15 need only be heated and pressed. Both during shaping of the card body and during the following steps embedded electronic module 3 is held in position exclusively by molding compound 15 so that no additional holding devices are necessary, as in injection molding for example. One nevertheless obtains a card body whose embedded element is surrounded by molding compound in form-fitting fashion.

It is also possible to provide molding compound 15 with certain additives, e.g. for producing certain properties in the card body. For example, if an electronic module for inductive data exchange is embedded in the card body one can add ferrite powder to the molding compound to improve the quality of the module coil and thus the energy input to the module.

It is furthermore possible to provide molding compound 15 with different additives in different layers. The molding compound located on the surface of the completed card body of the data carrier can be provided for example with additives which allow lasering of the surface, and the intermediate molding compound can be provided with ferrite powder as explained above. To obtain such a distribution, the recess of the die is charged with molding compound several times in accordance with the desired layers in the completed card body. Pressing of the molding compound thus gives rise to a basically single-layer card body which is nevertheless provided with different additives in different areas.

For producing semifinished products the recess in the die can also be charged with a quantity of molding compound smaller than the quantity which would be necessary for producing a molding in card thickness. The molding instead has a smaller thickness and can be provided with separately produced cover layers after removal from the pressing apparatus for completing the data carrier. For producing a semifinished product it is thus unnecessary to provide a special tool, as required e.g. in injection molding.

FIG. 2b shows in plan view electronic module 3 for non-contacting data exchange embedded in the data carrier. It consists of e.g. wire-wrapped coil 17 whose ends are electrically connected with contact surfaces 21 located on carrier film 19. Integrated circuit 23 is applied to the side of carrier film 19 opposite contact surfaces 21, being connected electrically with contact surfaces 21 e.g. by bonding wires 25 leading onto said surfaces through corresponding windows in carrier film 19. To be protected from mechanical loads bonding wires 25 and integrated circuit 23 can be sealed with a casting compound.

FIG. 3 shows in cross section a pressing apparatus consisting of die 9 and pressure ram 11. Pressure ram 11 contains suction apparatus 27 for positioning and fixing electronic module 3 on pressure ram 11 by suction air applied from outside in such a way that contact surfaces 21 of module 3 lie flat against the pressure ram. When pressure ram 11 is lowered into recess 13 of die 9 the electronic module is pressed at the specially provided position into molding compound 15 heated to the point of flowability. Fixation of the element on the end face of the pressure ram is thereby supported by the acting pressure, so that the element need only be fixed lightly to the ram. One thus obtains a data carrier containing an electronic module in the predetermined or standardized position. Other elements which are partly located on the surface of the data carrier can of course also be pressed into the card body in the stated manner. It is likewise possible to position and fix the elements in the recess instead of on the end face of the ram.

As an alternative to fixing the element on the end face of pressure ram 11 it is also possible to position the element directly in molding compound 15 after die 9 is charged therewith. Fixation of the element in position is then given exclusively by the surrounding molding compound. This procedure is especially favorable when it is unnecessary to position the elements in the completed data carrier very exactly, e.g. according to a standard.

FIG. 4 shows in cross section a pressing apparatus whose die 9 and pressure ram 11 have raised areas 29, 31 for forming recesses in the card body of the data carrier during the pressing operation in which corresponding elements are incorporated later. For example raised area 31 in the end face of pressure ram 11 gives rise to a recess for receiving an electronic module in the card body. Such a design of the pressing apparatus is particularly favorable when the card body is produced and the elements embedded therein at different places.

FIG. 5a shows in plan view cover layer 33 with the size of the main surface of a data carrier. The cover layer can be used as a carrier foil for one of the elements to be embedded in the data carrier. For example a magnetic or signature stripe or a hologram can be embedded in the cover layer. If cover layer 33 is to be used as a carrier foil for an electronic module it contains contact surfaces 21 below which windows are located (not shown). Furthermore cover layer 33 can contain a high-quality printed image and alphanumeric data 35 e.g. relating to the later card owner.

FIG. 5b shows in cross section a pressing apparatus consisting of die 9 and pressure ram 11. Cover layer 37 is first inserted in recess 13 of die 9 in such a way that the bottom of recess 13 is covered completely by the cover layer. Additional suction apparatus can be provided in the bottom area of recess 13 for fixing cover layer 37. After cover layer 37 is inserted recess 13 is charged with a measured quantity of molding compound 15 on which cover layer 35 is then placed. On the side of cover layer 35 opposite the contact surfaces integrated circuit 23 is glued in the area of contact surfaces 21 and electrically connected with contact surfaces 21 by bonding wires led onto said surfaces through windows 39. To be protected from mechanical loads bonding wires 25 and integrated circuit 23 are sealed with a casting compound.

During the pressing operation molding compound 15 softened to the point of flowability connects with cover layers 33 and 37, giving rise to a multilayer data carrier. Cover layers 33 and 35 can consist for example of a plastic material which connects especially well with the molding compound and be additionally coated inside with a thermally activated adhesive to improve the bond between the layers. The above-mentioned method thus produces a multilayer data carrier with embedded elements in simple fashion, whereby the cover layers of the data carrier can be provided with very high-quality printed images.

Although the figures show pressing apparatus for single card production, it is naturally also possible to provide pressing apparatus in which several cards can be manufactured simultaneously. In this case the die need only have a plurality of recesses in card size and the pressure ram a corresponding multiple design. Alternatively it is also possible to first manufacture a large plastic plate in the pressing apparatus out of which the data carriers are later punched or cut.

Finally it should be mentioned that the shown embodiment examples raise no claim to completeness. It is e.g. possible to combine different embodiment examples with one other without departing from the inventive idea. For example one can provide the card body whose production is shown in FIG. 2a with cover layers on both sides by proceeding in the way explained in connection with FIG. 5b.

We claim:

1. A method for producing a data carrier having a card body comprising two plane-parallel main surfaces and at least one data-carrying element, said method comprising the following steps:

(a) providing a pressing apparatus having a pressure ram whose end face corresponds to one of said main surfaces of the card body and a die with a recess whose base surface corresponds to one of said main surfaces and whose depth corresponds at least to the thickness of the card body, (b) charging the recess of the die with a measured quantity of molding compound comprising one of a plastic granular material and a powder, (c) heating the molding compound in said recess to the point of flowability, (d) performing a pressing operation by lowering the pressure ram into the recess of the die and pressing the molding compound in said recess with the pressure ram until the molding compound in the recess assumes desired dimensions to form said card body, (e) returning the pressure ram and removing the card body from the pressing apparatus, and (f) performing an operation comprising causing said element to be one of (i) at least partially embedded in said card body and (ii) disposed at least partly on one of said main surfaces of said card body.

2. The method for producing a data carrier of claim 1, wherein:

step (b) comprises charging the recess of the die with a first measured quantity of said molding compound so that the recess is filled with a first layer of said molding compound, step (f) comprises placing said element on the first layer in said recess, and step (b) further comprises charging the recess of the die with a second measured quantity of said molding compound to form a second layer of said molding compound so that said element is located between said first and second layers of the molding compound and surrounded thereby on all sides.

3. The method for producing a data carrier of claim 1, wherein step (f) comprises pressing said element into the molding compound during pressing of the molding compound with the pressure ram such that when said data carrier is completed, said element is located at least partly on one of said main surfaces of said card body.

4. The method for producing a data carrier of claim 3, wherein step (f) comprises positioning a part of the element such that said part is directly located on an end face of the pressure ram and fixed in position there until said pressing operation is completed.

5. The method for producing a data carrier of claim 3, wherein step (f) comprises inserting the element, before initiation of said pressing operation, into the molding compound located in the recess so as to be held in position by said compound.

6. The method for producing a data carrier of claim 1, wherein the pressure ram has raised areas for forming, when the molding compound is pressed, recesses in the card body into which said element can later be embedded.

7. The method for producing a data carrier of claim 1, wherein step (b) comprises:

inserting a first layer of a completed card corresponding in size to the main surface of the card body to be produced in the recess of the die, thereafter, charging the recess with said measured quantity of molding compound, and then, optionally placing a second layer of the completed card corresponding in size to the main surface of the card body to be produced in said recess on the molding compound.

8. The method for producing a data carrier of claim 7, wherein at least one of the first and second layers inserted in the recess contains an additional data-carrying element.

9. The method for producing a data carrier of claim 1, wherein the recess in the die has raised areas for forming, when the molding compound is pressed, recesses in the card body into which said element can later be embedded.

10. The method for producing a data carrier of claim 2 wherein the element is an electronic module for noncontacting data exchange.

11. The method for producing a data carrier of claim 3, wherein the element is an electronic module.

12. The method for producing a data carrier of claim 3, wherein the element is a magnetic stripe.

* * * * *